(12) United States Patent
Mattausch et al.

(10) Patent No.: US 7,746,678 B2
(45) Date of Patent: Jun. 29, 2010

(54) AMPLIFIER CIRCUIT AND ASSOCIATIVE MEMORY

(75) Inventors: Hans Juergen Mattausch, Higashihiroshima (JP); Tetsushi Koide, Higashihiroshima (JP); Yuki Tanaka, Higashihiroshima (JP); Md. Anwarul Abedin, Higashihiroshima (JP)

(73) Assignee: Hiroshima University, Hiroshima (JP)

( * ) Notice: Subject to any disclaimer, the term of this patent is extended or adjusted under 35 U.S.C. 154(b) by 0 days.

(21) Appl. No.: 12/528,776

(22) PCT Filed: Feb. 22, 2008

(86) PCT No.: PCT/JP2008/000309

§ 371 (c)(1),
(2), (4) Date: Aug. 26, 2009

(87) PCT Pub. No.: WO2008/105157

PCT Pub. Date: Sep. 4, 2008

(65) Prior Publication Data

US 2010/0085790 A1    Apr. 8, 2010

(30) Foreign Application Priority Data

Feb. 27, 2007    (JP) ............................ 2007-046555

(51) Int. Cl.
G11C 15/00    (2006.01)
(52) U.S. Cl. .................. 365/49.1; 365/49.17; 365/207; 330/260
(58) Field of Classification Search ................ 365/49.1, 365/49.17, 207; 330/252, 260
See application file for complete search history.

(56) References Cited

U.S. PATENT DOCUMENTS

| 5,333,127 | A  | * | 7/1994 | Hiraki et al. ............... 365/207 |
| 6,853,251 | B2 | * | 2/2005 | Mattausch et al. .......... 330/293 |
| 6,856,528 | B1 | * | 2/2005 | Kim ......................... 365/49.1 |

FOREIGN PATENT DOCUMENTS

| JP | 2000-298995 | 10/2000 |
| JP | 2002-288985 | 10/2002 |
| JP | 2004-005825 | 1/2004 |
| JP | 2005-209317 | 8/2005 |

OTHER PUBLICATIONS

Abedin, Md. Anwarul et al., "Mixed Digital-Analog Associative Memory Enabling Fully-Parallel Nearest Euclidean Distance Search," *Japanese Journal of Applied Physics (JJAP)*, vol. 46, No. 4B, 2007, pp. 2231-2237.

(Continued)

*Primary Examiner*—Huan Hoang
(74) *Attorney, Agent, or Firm*—Foley & Lardner LLP

(57) ABSTRACT

An amplifier circuit according to the present invention includes a plurality of input nodes receiving a plurality of input voltages ($VI_1$ to $VI_R$), a plurality of differential amplifiers provided corresponding to the plurality of input nodes, each having one input which receives a voltage of the corresponding input node, and a control circuit generating a control voltage (CONTROL) that follows a minimum voltage or a maximum voltage of the plurality of input voltages ($VI_1$ to $VI_R$) from outputs of the plurality of differential amplifiers and supplying the generated control voltage (CONTROL) as a common value to the other inputs of the plurality of differential amplifiers.

6 Claims, 8 Drawing Sheets

OTHER PUBLICATIONS

Mattausch, Hans Jürgen et al., "Compact Associative-Memory Architecture With Fully Parallel Search Capability for the Minimum Hamming Distance," *IEEE Journal of Solid-State Circuits*, vol. 37, No. 2, Feb. 2002, pp. 218-227.

Mattausch, Hans Jürgen et al., "Fully-Parallel Pattern-Matching Engine with Dynamic Adaptability to Hamming or Manhattan Distance," Jun. 13-15, 2002, *2002 Symposium on VLSI Circuits Digest of Technical Papers, IEEE and The Japan Society of Applied Physics*, pp. 252-255.

Tveter, D. R., "The Pattern Recognition Basis of Artificial Intelligence," IEEE Computer Society Press, 2008, ISBN 0-8186-7791-1, Los Alamitos, California, 1998, pp. 86-92.

Yano, et al., "Fully Parallel Nearest Manhattan-Distance-Search Memory With Large Reference-Pattern Number," *Extended Abstracts of the 2002 International Conference on Solid State Devices and Materials*, 2002, pp. 254-255.

\* cited by examiner

- CURRENT APPLIED TO I·II IS MIRRORED TO DETERMINE OUTPUT VOLTAGE
- CURRENT APPLIED TO I IS HIGH → OUTPUT VOLTAGE BECOMES HIGH
- CURRENT APPLIED TO II IS HIGH → OUTPUT VOLTAGE BECOMES LOW

AMPLIFIER CIRCUIT AND ASSOCIATIVE MEMORY

TECHNICAL FIELD

The present invention relates to a circuit amplifying a voltage difference between a minimum voltage or a maximum voltage, and any other voltage among plural input voltages, and an associative memory using the amplifier circuit.

BACKGROUND ART

In the recent field of information processing technology, especially in the field of image compression/image recognition, the associative memory with a minimum distance retrieval function has been focused. The associative memory is very effective for the pattern matching performed to recognize the object, which is required for the intellectual information processing, and for the data compression utilizing data group so-called codebook. The associative memory is one of typical function memories for searching data with the highest similarity (short distance) to the input data sequence (retrieval data) among plural reference data stored in the associative memory. The use of the excellent retrieval function is expected to markedly improve the performance of the application with the pattern matching function such as the image compression and image recognition as described above.

Searching the data with the highest similarity to the input data from R reference data with W bit width is the basic process for the pattern matching (refer to Non-Patent Document 1). The minimum distance retrieval associative memory (refer to Patent Document 1) may be regarded as the core technology in the information processing such as the image compression and the image recognition. The fully parallel type minimum distance retrieval associative memories each with the retrieval function with respect to Hamming distance, Manhattan distance, and Euclidean distance as the simple distance have been already proposed. Each of the aforementioned distances may be expressed by the following formulae 1 and 2 (refer to Non-Patent Document 2).

$$D = \sum_{i=1}^{w} |S_i - R_i|$$ [Formula 1]

... Hamming distance, Manhattan distance $$D = \sqrt{\sum_{i=1}^{w} (S_i - R_i)^2}$$ [Formula 2]

... Euclidean distance

The term $S=\{S_1, S_2, \ldots, S_w\}$ denotes the input data, and the term $R=\{R_1, R_2, \ldots, R_w\}$ denotes the reference data. Assuming that each of $S_i$ and $R_i$ takes 1-bit binary number, D becomes the Hamming distance in the formula 1. Assuming that each of $S_i$ and $R_i$ takes n-bit (n>1) binary number, D becomes the Manhattan distance in the formula 1. Referring to the formula 2, the D becomes Euclidean distance.

Such art as fully parallel type minimum Hamming distance retrieval architecture [refer to Non-Patent Document 2] and fully parallel type minimum Manhattan distance retrieval architecture [Non-Patent Documents 3 and Patent Document 2] have been disclosed so far. The general structure of the fully parallel type associative memory which employs the aforementioned architecture is shown in FIG. 1.

The associative memory includes a unit data storage circuit (Unit Storage: US), a unit data comparator circuit (Unit Comparator: UC), a word comparator circuit (Word Comparator: WC), a Winner Line-up amplifier (Winner Line-up Amplifier: WLA) circuit 100, and a Winner Take All (WTA) circuit 200.

The unit data storage circuit stores the reference data. The unit data comparator circuit compares the reference data with the retrieval data. The word comparator circuit converts a comparison signal into a current value. The Winner Line-up amplifier circuit (WLA circuit: Winner Line-up Amplifier circuit) 100 converts a comparison current signal into a voltage to amplify. The Winner Take All circuit 200 further amplifies the output from the WLA circuit 100. The associative memory includes peripheral circuits such as a retrieval data storage circuit, a row decoder, a column decoder, and a Read/Write circuit.

The unit data comparator circuit UC compares the reference data with the retrieval data, and the word comparator circuit WC outputs a comparison current signal C indicating results of the comparison between the reference data and the retrieval data to the WLA circuit 100. The WLA circuit 100 converts the comparison current signal C into a comparison voltage signal LA and amplifies the comparison voltage signal LA. The WTA circuit 200 further amplifies the comparison voltage signal LA, and sets a threshold value to output 1 indicating the data with the highest similarity (Winner), and output 0 indicating the other data (Loser).

[Patent Document 1] Japanese Unexamined Patent Application Publication No. 2002-288985

[Patent Document 2] Japanese Unexamined Patent Application Publication No. 2005-209317

[Patent Document 3] Japanese Unexamined Patent Application Publication No. 2004-5825

[Non-Patent Document 1] D. R. Tveter, "The Pattern Recognition Basis of Artificial Intelligence," Los Alamitos, Calif.: IEEE computer society, 1998.

[Non-Patent Document 2] H. J. Mattausch, T. Gyohten, Y. Soda, and T. Koide, "Compact Associative-Memory Architecture with Fully-Parallel Search Capability for the Minimum Hamming Distance," IEEE Journal of Solid-State Circuits, Vol. 37, pp. 218-227, 2002.

[Non-Patent Document 3] H. J. Mattausch, N. Omori, S. Fukae, T. Koide and T. Gyohten, "Fully-Parrallel Pattern-Matching Engine with Dynamic Adaptability to Hamming or Manhattan Distance," 2002 Symposium on VLSI Circuits Digest of Technical Papers, pp. 252-255, 2002.

[Non-Patent Document 4] Y. Yano, T. Koide and H. J. Mattausch, "Fully Parallel Nearest Manhattan-distance Search Memory with Large Reference-pattern Number," Extend. Abst. Of the Int. Conf. on Solid State Devices and Materials (SSDM' 2002), pp. 254-255, 2002.

[Non-Patent Document 5] M. A. Abedin, Y. Tanaka, A. Ahmadi, T. Koide and H. J. Mattausch, "Mixed Digital-Analog Associative Memory Enabling Fully-Parallel Nearest Euclidean Distance Search," Japanese Journal of Applied Physics (JJAP), vol. 46, NO. 4B, in press, (accepted on Jan. 12, 2007).

DISCLOSURE OF INVENTION

In FIG. 1, the word comparator circuit WC, the WLA circuit 100 and the WTA circuit 200 are analog circuits, and realize the fully parallel minimum distance retrieval. The operation speed of the circuit for amplifying the voltage difference between the minimum distance data and the other data is low in the aforementioned circuits. So the retrieval of the minimum distance takes long time. Besides, the false retrieval is caused by the signal input delay, thus deteriorating reliability. FIG. 2 shows the structure of the conventional circuit.

The present invention has been made to solve the aforementioned problems, and it is an object of the present invention to provide an amplifier circuit capable of enhancing reliability of the minimum distance retrieval.

It is another object of the present invention to provide an associative memory equipped with the amplifier circuit capable of enhancing reliability of the minimum distance retrieval.

The amplifier circuit according to the present invention includes a plurality of input nodes receiving a plurality of input voltages, a plurality of differential amplifiers provided corresponding to the plurality of input nodes, each having one input which receives a voltage of the corresponding input node, and a control circuit generating a control voltage that follows a minimum voltage or a maximum voltage of the plurality of input voltages from outputs of the plurality of differential amplifiers to supply the generated control voltage as a common value to the other inputs of the plurality of differential amplifiers.

In the amplifier circuit, the control circuit includes a plurality of first MOS transistors which are provided corresponding to the plurality of differential amplifiers, allow a gate to receive an output of the corresponding differential amplifier, and are connected in parallel between the node to which the other inputs of the plurality of differential amplifiers are commonly connected, and the node which receives a first power supply voltage, and a second MOS transistor connected between the node to which the other inputs of the plurality of differential amplifiers are commonly connected and a node which receives a second power supply voltage and allowing a gate to receive a predetermined bias voltage.

The amplifier circuit further includes a capacity connected to the node to which the other inputs of the plurality of differential amplifiers are commonly connected.

The amplifier circuit further includes a voltage follower circuit provided between a common connection node of the plurality of first MOS transistors and the second MOS transistor, and a common connection node of the other inputs of the plurality of differential amplifiers.

The amplifier circuit further includes a voltage reduction circuit provided between a common connection node of the plurality of first MOS transistors and the second MOS transistor, and a common connection node of the other inputs of the plurality of differential amplifiers and reduces the voltage supplied to the other inputs of the plurality of differential amplifiers.

An associative memory according to the present invention includes a memory array unit performing a parallel comparison between each of preliminarily stored plurality of reference data and input retrieval data and generating a plurality of comparison current signals having current values corresponding to the respective comparison results, a WLA (Winner Line-up Amplifier) circuit converting the plurality of comparison current signals into voltages to amplify, and a WTA (Winner Take All) circuit further amplifying an output from the WLA circuit. The WLA circuit includes a plurality of current-voltage conversion circuits provided corresponding to the plurality of comparison current signals to convert the corresponding comparison current signal into a comparison voltage signal, a plurality of differential amplifiers provided corresponding to the plurality of current-voltage conversion circuits to allow one input to receive the comparison voltage signal from the corresponding current-voltage conversion circuit, and a control circuit generating a control voltage which follows a minimum voltage or a maximum voltage of the plurality of comparison voltage signals from outputs of the plural differential amplifiers and supplying the generated control voltage as a common value to the other inputs of the plurality of differential amplifiers.

The amplifier circuit according to the present invention controls the operation range of the differential amplifier by fixing the level of the input voltage applied to one input of each of the plurality of differential amplifiers under no control, and applying the common control voltage to the other inputs. When the aforementioned amplifier circuit is employed for the WLA circuit of the associative memory, for example, the feedback control will be performed on an as-needed basis. Therefore, upon the operation, correction is carried out to allow the correct self minimum distance retrieval. This enables the accurate minimum distance retrieval in the stable operation state in the end. The comparison voltage signal to be input to the differential amplifier is not controlled, but the comparative object is controlled (controlling of the control voltage). Even if the circuit is directed toward the false retrieval, the operation may be corrected immediately.

BEST MODE FOR CARRYING OUT THE INVENTION

Figure 1:
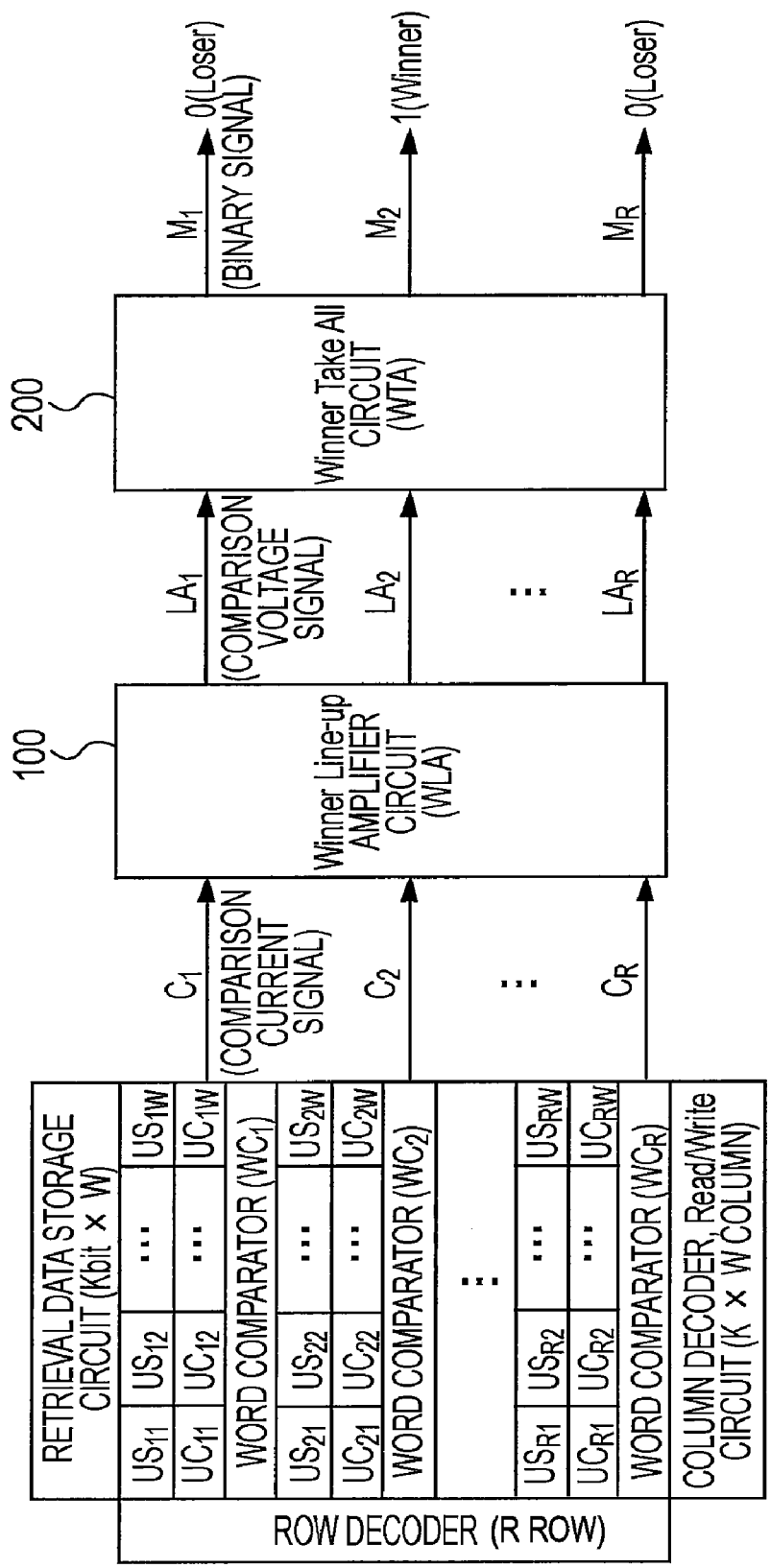
FIG. 1 is a block diagram schematically showing a structure of a fully parallel type associative memory.

Examples of the present invention will be described in detail referring to the drawings. The same or the equivalent element in the drawing will be designated with the same reference numeral, and the explanation thereof may be omitted.

[Fully Parallel Type Associative Memory]

FIG. 1 schematically shows a structure of a fully parallel type associative memory according to an embodiment of the present invention. The associative memory includes a unit data storage circuit (Unit Storage: US) which stores reference data, a unit data comparator circuit (Unit comparator: UC) which compares the reference data with retrieval data, a word comparator circuit (Word Comparator: WC) which converts a comparison signal into a current value, a Winner Line-up amplifier (Winner Line-up Amplifier: WLA) circuit 100 which converts the comparison current signal into the voltage to amplify, and a Winner Take All (WTA) circuit 200 which further amplifies the output from the WLA circuit 100. The associative memory includes peripheral circuits such as a retrieval data storage circuit, a row decoder, a column decoder, and a Read/Write circuit.

The unit data comparator circuit UC compares the reference data with the retrieval data. The word comparator circuit WC outputs a comparison current signal C which indicates results of comparison between the reference data and the retrieval data to the WLA circuit 100. The WLA circuit 100 converts the comparison current signal C into a comparison voltage signal LA to amplify. The WTA circuit 200 further amplifies the comparison voltage signal LA, and sets a threshold value so as to output the highest similarity data (Winner) as 1, and the other data (Loser) as 0 in the end.

The associative memory performs the fully parallel operation to enable the high speed retrieval. As the word comparator circuit WC, the WLA circuit 100, and the WTA circuit 200 are operated with analog, the occupied area may be largely reduced compared with the digital associative memory using the circuits all of which are of digital types.

The block diagram showing the structure of the associative memory according to the embodiment (FIG. 1) is the same as that of the related art. The associative memory according to the embodiment is characterized by inner structures of the WLA circuit 100 and the WTA circuit 200.

[WLA Circuit 100]

Figure 3:
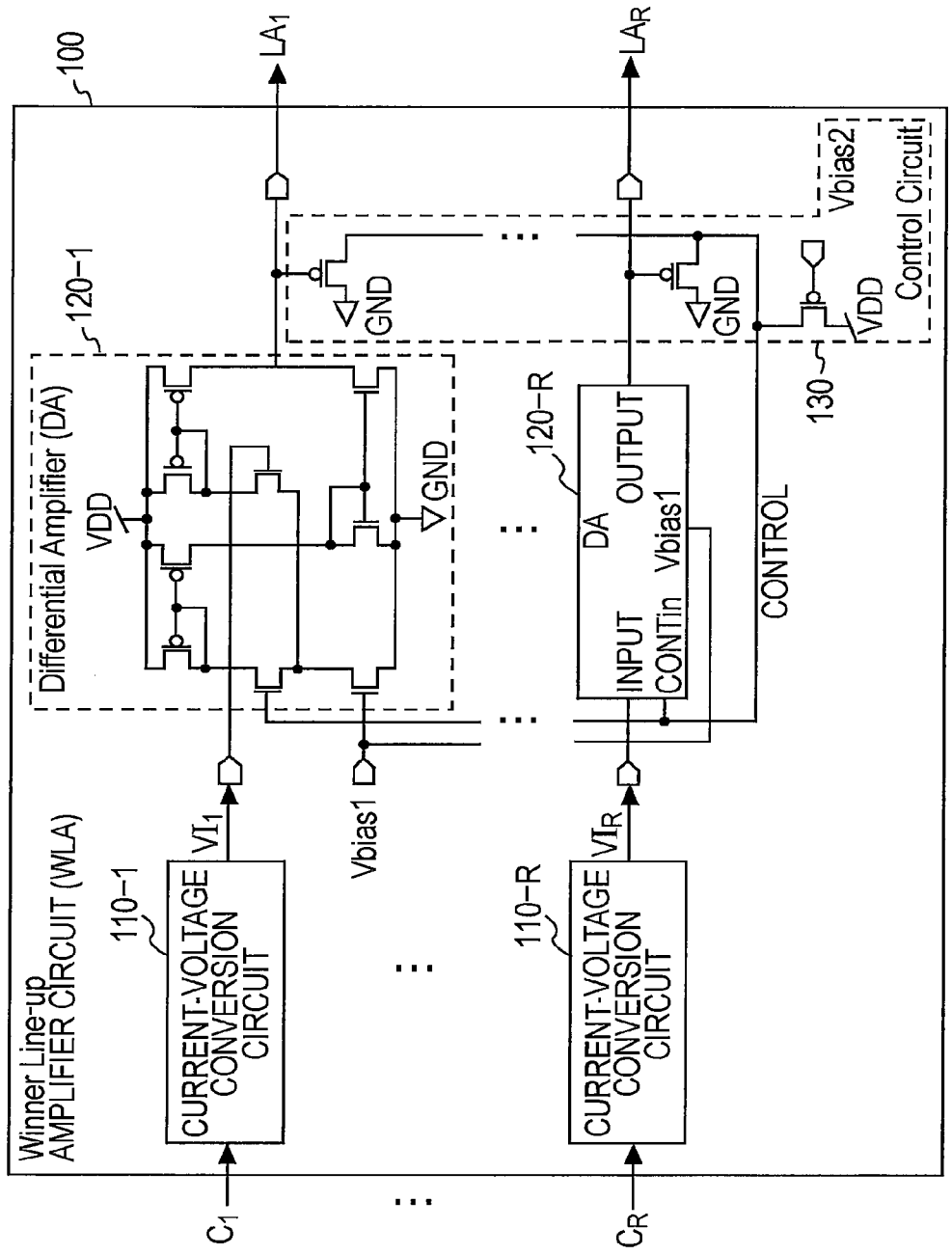
FIG. 3 is a circuit diagram showing an inner structure of a WLA circuit according to an embodiment of the present invention.

FIG. 3 shows the inner structure of the WLA circuit 100 according to the embodiment. The WLA circuit 100 includes current-voltage conversion circuits 110-1 to 110-R, differential amplifiers 120-1 to 120-R, and a control circuit 130.

The word comparator circuits WC1 to WCR preliminarily input the minimum distance data (Winner) as a low comparison current signal, and the other data (Losers) as high comparison current signals $C_1$ to $C_R$ into the WLA circuit 100, respectively. Those signals are converted by the current-voltage conversion circuits 110-1 to 110-R into comparison voltage signals $VI_1$ to $VI_R$. The comparison current signals $C_1$ to $C_R$ from the word comparator circuits $WC_1$ to $WC_R$ are minimized in a Winner row. The comparison voltage signals $VI_1$ to $VI_R$ are also minimized on the Winner row.

Each of the comparison voltage signals $VI_1$ to $VI_R$ is input to one input of each of the corresponding differential amplifiers 120-1 to 120-R. A CONTROL voltage from the control circuit 130 as the common signal is input to the other inputs of the differential amplifiers 120-1 to 120-R.

The control circuit 130 generates the CONTROL voltage at substantially the same level as the comparison voltage signal VI of the Winner column (minimum distance data).

When the distance between the input data and the Winner increases and the distance between the Winner and the Losers decreases, each voltage difference of the comparison voltage signals $VI_1$ to $VI_R$ is in the order of several mVs. In the conventional circuit [Patent Document 1], the WTA circuit (amplifier) with several stages is required for amplification of the voltage difference at several mVs with low amplification to distinguish the data based on the threshold value. The resultant time for retrieving, power consumption, and the area are increased. The embodiment employs the wide range differential amplifiers 120-1 to 120-R to overcome the disadvantage of the conventional fully parallel type associative memory.

[Operations of Differential Amplifiers 120-1 to 120-R]

Figure 4:
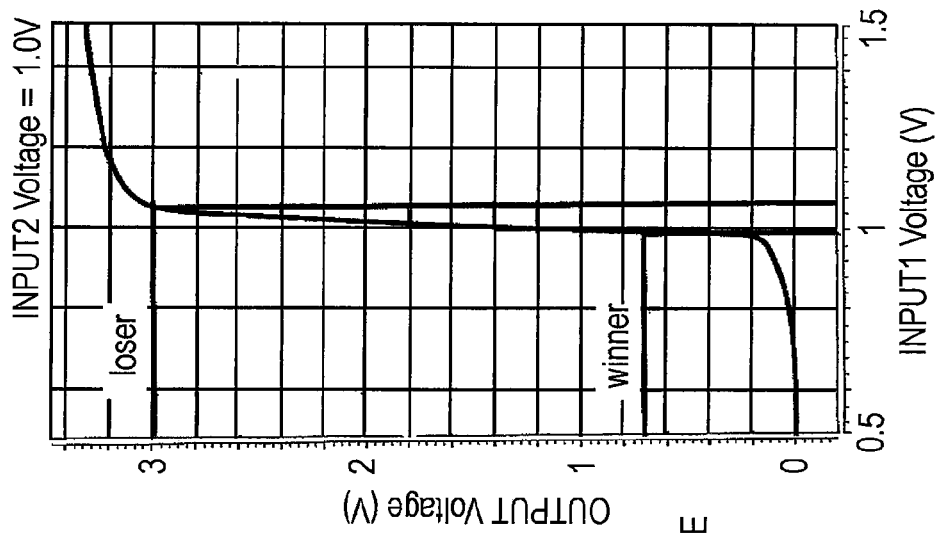
FIG. 4 is an explanatory view with respect to an operation of a differential amplifier inside the WLA circuit.
Figure 4:
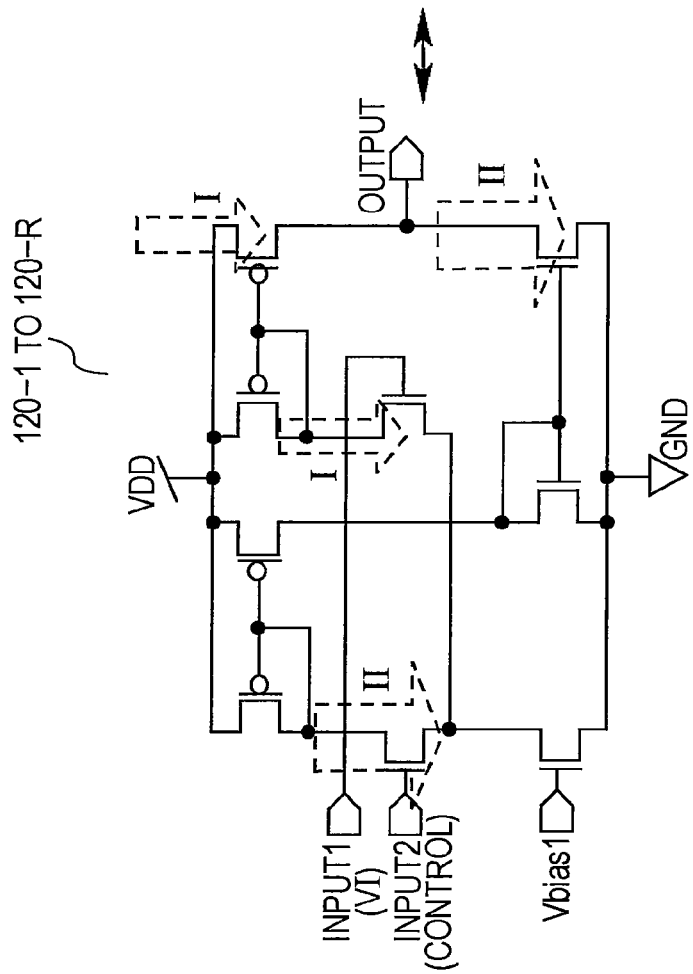

Referring to FIG. 4, in each of the wide range differential amplifiers 120-1 to 120-R, if voltage of INPUT1 (VI)<voltage of INPUT2 (CONTROL), the output voltage becomes GND (Winner), and if INPUT1 (VI)>INPUT2 (CONTROL), the output voltage becomes VDD (Losers). The OUTPUT voltage becomes GND in case of Winner, and becomes VDD in case of Loser. Referring to the graph of FIG. 4, the input voltage difference is output depending on each amplification degree of the differential amplifiers 120-1 to 120-R. The specific operations will be described hereinafter.

Voltages of INPUT1 and CONTROL in the non-operative state are pre-charged to VDD. The voltages of Winner and Losers are input to the INPUT1 in the operative state. As the voltages of the Winner and Losers are input, the voltage of INPUT1 decreases to reduce the OUTPUT voltage subsequently. The OUTPUT voltage decreases to increase the current applied to a voltage follower of the control circuit 130, thus gradually reducing the CONTROL voltage. As the CONTROL voltage is reduced, the OUTPUT voltage decreases to a certain level. When the current applied from the VDD becomes equal to the one applied to GND in the control circuit 130, the CONTROL voltage is stabilized. The voltage input to the INPUT1 is controlled by the word comparator circuit WC preliminarily such that the Winner row becomes the lowest. The OUTPUT voltage drops first, and therefore the CONTROL voltage follows the Winner voltage.

[Feature]

Figure 2:
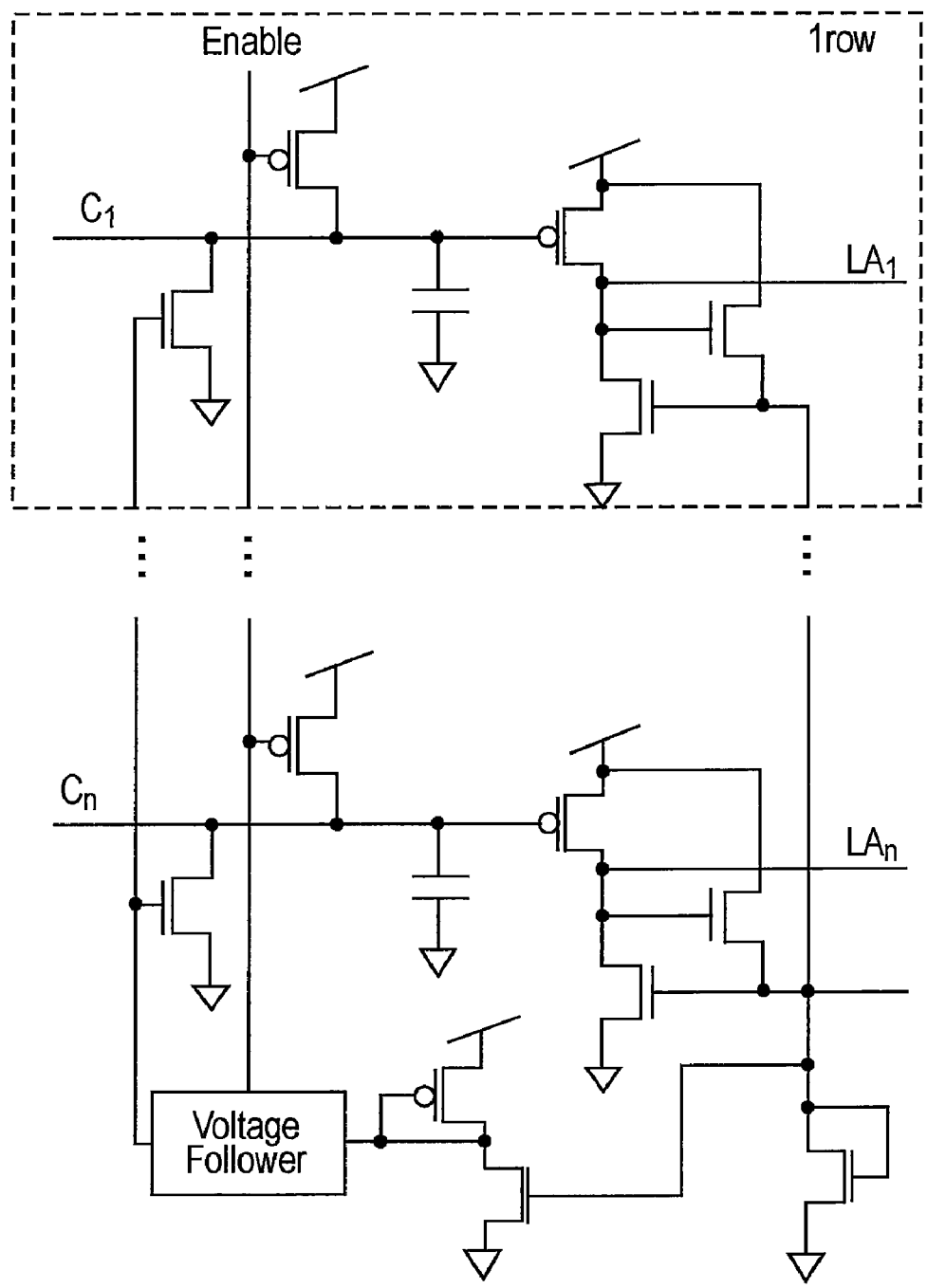
FIG. 2 is a circuit diagram showing an inner structure of a conventional WLA circuit.

The conventional WLA circuit (FIG. 2) is structured to directly control each level of the comparison voltage signals $VI_1$ to $VI_R$ input to the amplifier so as to be within the operation range of the amplifier. Unlike the conventional WLA circuit, the WLA circuit 100 (FIG. 3) according to the embodiment is structured to control the operation range by fixing the levels of the comparison voltage signals $VI_1$ to $VI_R$ input to the amplifiers 120-1 to 120-R, and applying the CONTROL voltage to the other inputs of the amplifiers 120-1 to 120-R. The large difference in the amplification level is the advantage of the circuit according to the embodiment. The advantageous points of the WLA circuit 100 according to the embodiment will be described hereinafter.

[1] High Amplification Degree

The conventional WLA circuit requires four to six stages for amplifying the difference of several mVs to the several Vs. Meanwhile, the embodiment employs the differential amplifiers 120-1 to 120-R, requiring only two stages. The aforementioned effect leads to the high-speed retrieval, low power consumption, higher reliability, and reduced area.

[2] Good Area Efficiency

As described in [1], the required number of the circuit stages may be ½ to ⅓ of the number of stages in the conventional circuit. The area, thus, may be reduced correspondingly (The number of transistors on the single stage of the WTA is three times as large as the number of the transistors in the conventional circuit. However, as the transistor of the conventional circuit is larger, they are regarded as substantially equivalent.).

[3] High Speed Minimum Distance Retrieval

The issue "long period of time for the minimum distance retrieval owing to the low operation speed of the circuit for amplifying the voltage difference between the minimum distance data and the other data" has been regarded as the problem. The use of the wide range differential amplifiers 120-1 to 120-R allows the difference of several mVs to be amplified to several Vs, resulting in the high-speed minimum distance retrieval. In the conventional WLA circuit, the operation speed is decelerated at the high voltage. On the contrary, the circuit according to the embodiment allows the high speed operation. Each level of the comparison voltage signals $VI_1$ to $VI_R$ input to the respective differential amplifiers 120-1 to 120-R is not controlled, thus reducing the number of the transistors associating the input voltage as least as possible. The resultant load capacity is reduced to accelerate the operation speed.

[4] Self Correction

The WLA circuit 100 according to the embodiment includes a feedback unit for the control (control circuit 130). The conventional circuit performs the sequential feedback control, and accordingly, tends to fail to cope with the signal delay. Meanwhile, the circuit according to the embodiment performs the feedback control on the as-needed basis, and executes the correction for automatically performing the correct minimum distance retrieval upon operation. This finally enables the accurate minimum distance retrieval in the stable operation state.

[5] Insusceptible to Noise

Noise is likely to be added to the input signal upon production of chip and the actual operation. In a certain case, such noise may cause the false operation and false retrieval. The use of the differential amplifier allows two inputs to perform the differential control, resulting in insusceptibility to the noise in the same phase.

[6] Low Power Consumption

Upon operation, the WLA circuit 100 according to the embodiment applies a large current only to the control circuit for the minimum distance data row, thus maintaining the low power consumption.

[7] High Reliability

When using a large number of analog circuits, the operation is likely to be unstable owing to variation in the characteristics of the produced transistor. In the related art, four to six stages of the WLA and WTA circuits are required for accurately performing the minimum distance retrieval up to sufficiently large distance. Meanwhile, the embodiment requires only two stages of circuits, thus reducing the number of the analog circuits. This may improve reliability of the entire circuit. The WLA circuit 100 of the embodiment is not structured to control the comparison voltage signals $VI_1$ to $VI_R$ input to the differential amplifiers 120-1 to 120-R, but is structured to control the comparative object (CONTROL voltage is controlled). Therefore, if the circuit is directed toward the false retrieval, such operation may be corrected immediately.

The digital circuit may be focused as a comparative circuit for discussing about reliability. The digital circuit is capable of obtaining the accurate output with respect to the whole distance so long as no circuit destruction nor signal timing error occurs. The application using the minimum distance retrieval may cause large difference in the distance with respect to the input data apart from a predetermined distance or longer. The minimum distance retrieval, thus, does not have to be performed (for example, as the distance 128 is different from the maximum distance 512 by ¼ on data, it may be determined that no minimum distance data are searched depending on the application.). The circuit of the embodiment may be structured to allocate the voltage difference of the input voltage with priorities from the shorter distance (|distance 1−distance 2|=50 mV, |distance 50−distance 51|=20 mV). The use of the circuit at the higher amplification degree allows the minimum distance retrieval up to the distance 100 without practical difficulties.

The circuit according to the embodiment is advantageous because it is capable of performing the accurate minimum distance retrieval with respect to the practically sufficient distance, demonstrates the lower power consumption and shorter retrieval period compared with the digital circuit.

Modified Example 1 of WLA Circuit 100

The use of only the differential amplifiers 120-1 to 120-R and the control circuit 130 may largely fluctuate the output voltage prior to stabilization. For the purpose of coping with the fluctuation, a capacity 140 is added to the output of the control circuit 130 to suppress large fluctuation.

Modified Example 2 of WLA Circuit 100

Figure 6:
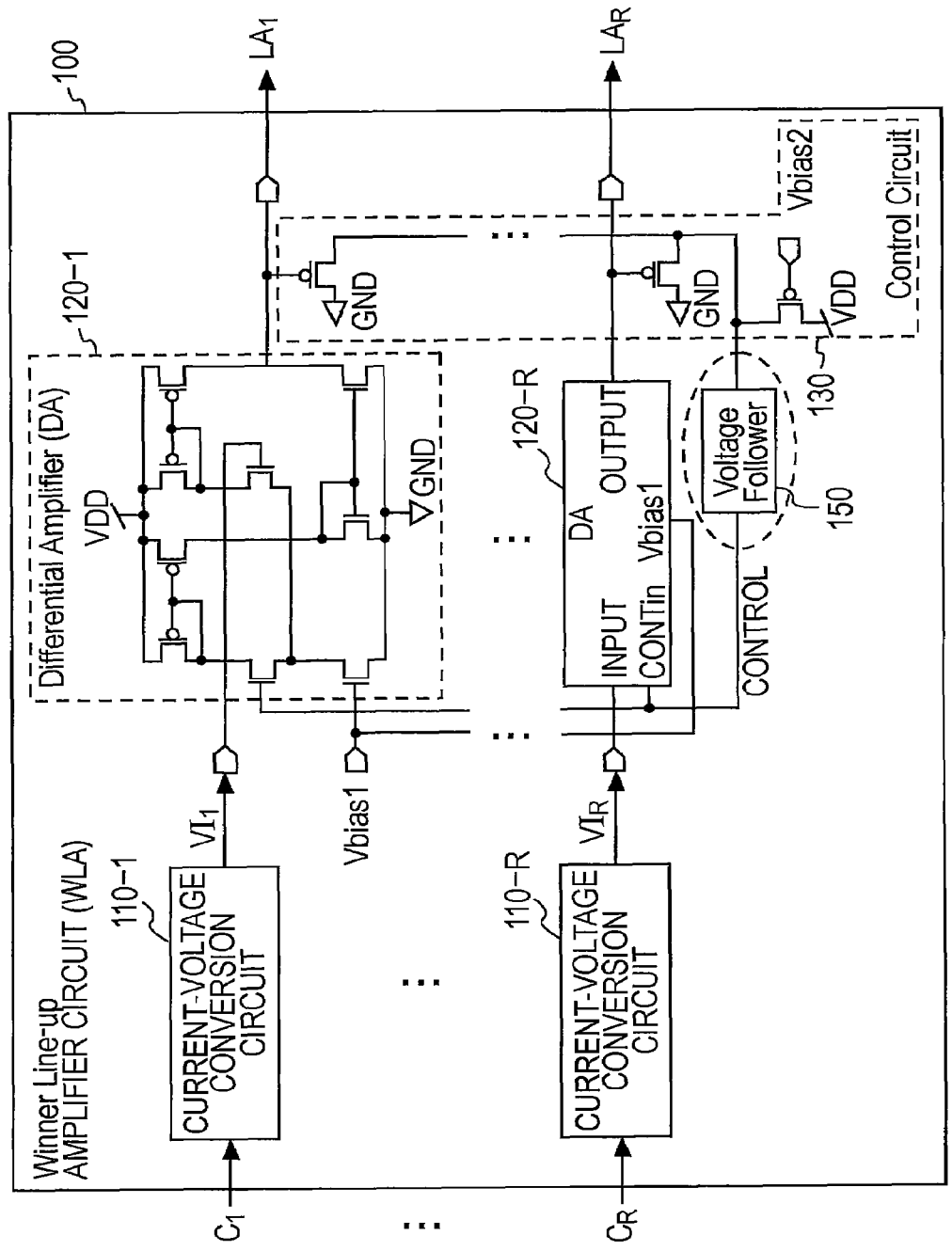
FIG. 6 is a circuit diagram showing an inner structure of the WLA circuit according to an embodiment of the present invention.

The voltage of a CONTROL line is determined by the control circuit 130. The voltage, however, is limited, and fails to cover all of the range from GND to VDD. The larger transistor is required for dropping the CONTROL line voltage to GND in a short period of time. For the purpose of coping with the aforementioned problem, a Voltage Follower circuit 150 is added as shown in FIG. 6. This may cover a most part of the range from GND to VDD, thus allowing the high speed operation and suppressing the transistor size.

Modified Example 3 of WLA Circuit 100

Figure 7:
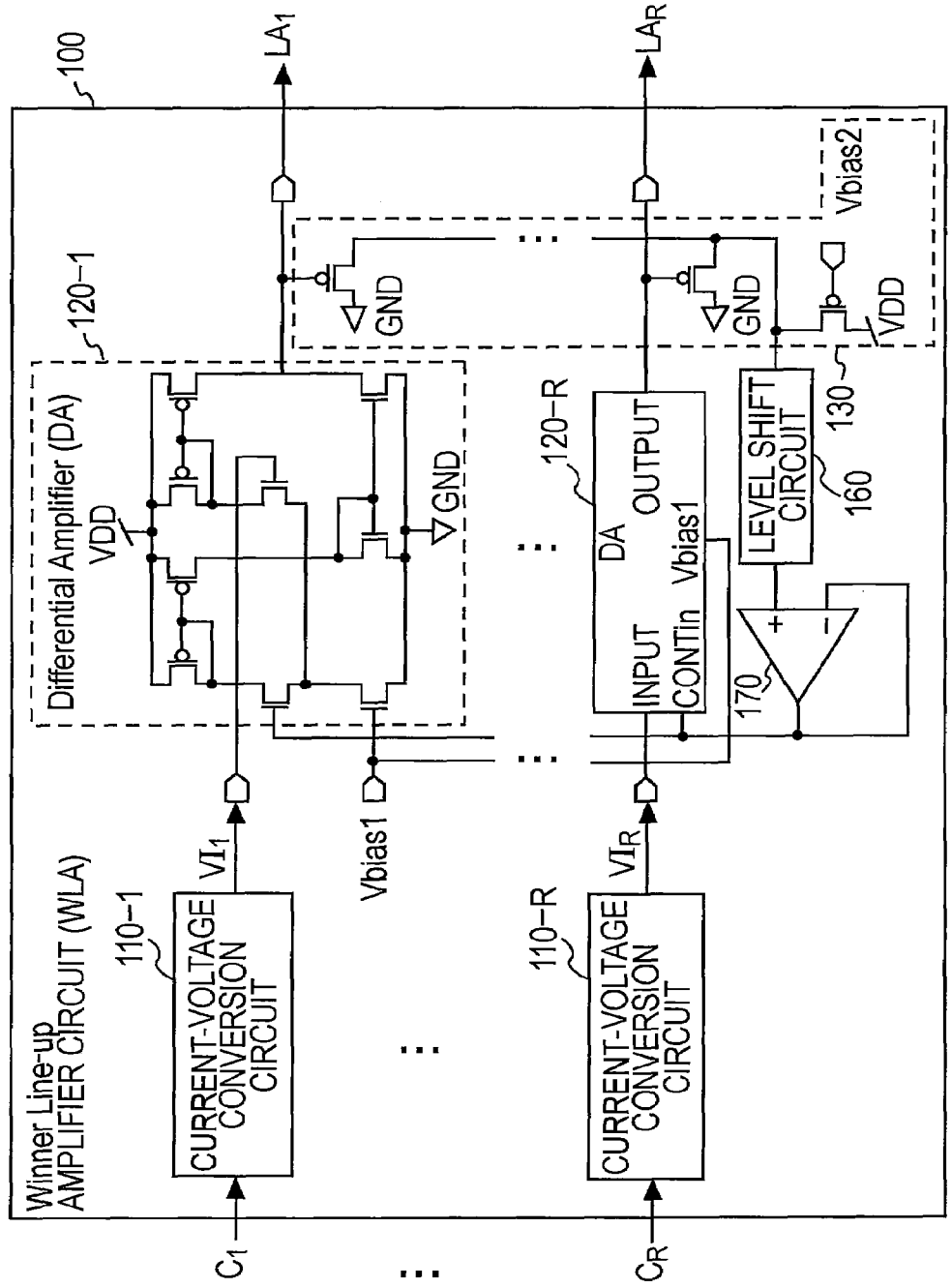
FIG. 7 is a circuit diagram showing an inner structure of the WLA circuit according to an embodiment of the present invention.

FIG. 7 is a circuit diagram showing the inner structure of the WLA circuit according to the embodiment of the present invention. The WLA circuit 100 shown in FIG. 7 includes a level shift circuit 160 and a differential amplifier 170 instead of the Voltage Follower circuit 150 of the WLA circuit 100 as shown in FIG. 6.

The level shift circuit 160 is connected between the control circuit 130 and a noninverting input of the differential amplifier 170. The differential amplifier 170 has a noninverting input terminal and an output terminal connected to CONTin terminals of the differential amplifiers 120-1 to 120-R.

The level shift circuit 160 lowers the level of the voltage supplied from the control circuit 130 to the lower limit value in the operation voltage range of the differential amplifier 170. The lowered voltage is supplied to the noninverting input terminal of the differential amplifier 170. More specifically, assuming that the operation voltage range of the differential amplifier 170 is set from 0.4 to 1.4 V, the level shift circuit 160 lowers the voltage supplied from the control circuit 130 to 0.4 V and supplies the lowered voltage to the noninverting input terminal of the differential amplifier 170.

The differential amplifier 170 amplifies the voltage supplied from the level shift circuit 160, and supplies the amplified voltage to the CONTin terminals of the differential amplifiers 120-1 to 120-R as the CONTROL voltage.

Figure 5:
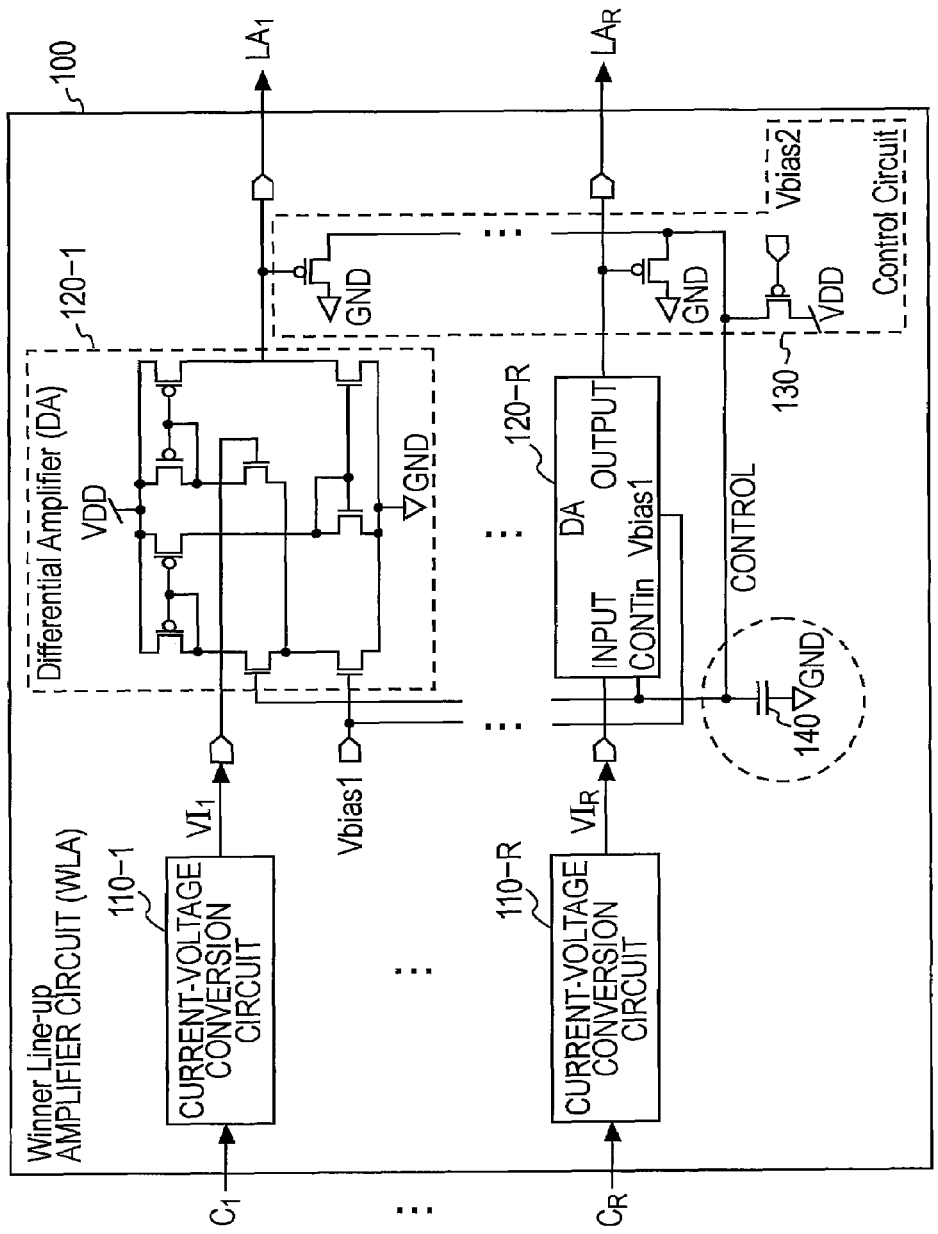
FIG. 5 is a circuit diagram showing an inner structure of the WLA circuit according to an embodiment of the present invention.

The level shift circuit 160 and the differential amplifier 170 decrease the CONTROL voltage supplied to the differential amplifiers 120-1 to 120-R so as to be lower than the one in the case where the level shift circuit 160 and the differential amplifier 170 are not provided (as shown in FIG. 5).

As a result, each of the differential amplifiers 120-1 to 120-R output the output signal constituted of the voltage higher than the voltage in the case where the level shift circuit 160 and the differential amplifier 170 are not provided (as shown in FIG. 5).

Therefore, the WTA circuit 200 on the next stage may be operated at high speeds.

The level shift circuit 160 and the differential amplifier 170 constitute a "voltage reduction circuit" reducing the CONTROL voltage supplied to the CONTin terminals of the differential amplifiers 120-1 to 120-R.

[WTA Circuit 200]

Figure 8:
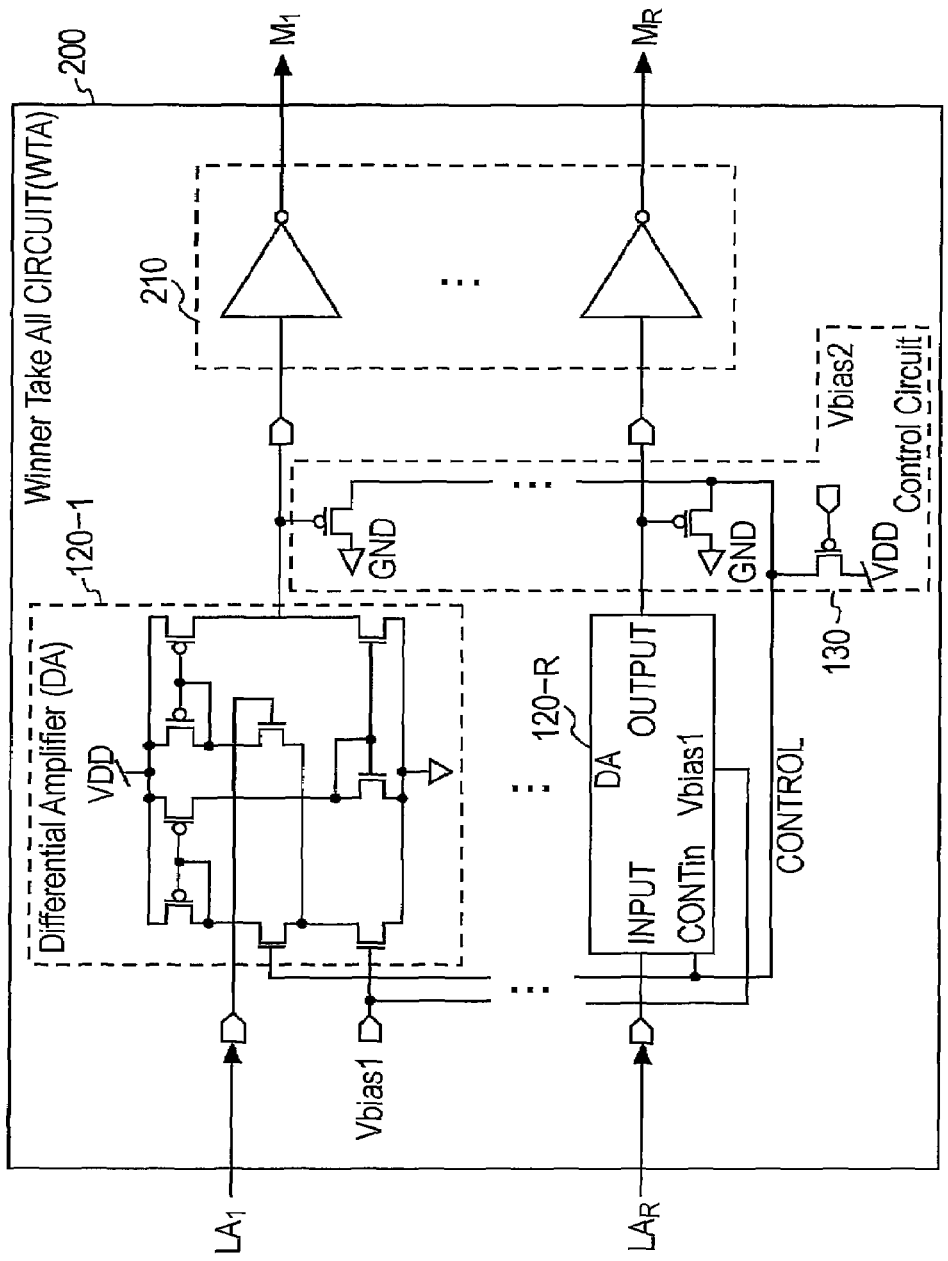
FIG. 8 is a circuit diagram showing an inner structure of the WTA circuit according to an embodiment of the present invention.

Referring to FIG. 8, likewise the WLA circuit 100, the amplifier circuit according to the embodiment is applied to the WTA circuit 200. The WTA circuit 200 further amplifies the comparison voltage signals LA1 to LAR from the WLA circuit 100. A final determination circuit 210 outputs 1 to the Winner row as a matched signal M, and outputs 0 to the other Loser rows. The WTA circuit 200 may be modified from the structure shown in FIG. 5 to the one shown in FIG. 7 likewise the WLA circuit 100.

[Evaluation Through Simulation]

The performance of the associative memory of the example is confirmed through the circuit simulation using the circuit simulation software HSPICE. The technology as 0.35 μm CMOS is used for designing the associative memory of 64 reference data formed of 15 5-bit binary data. The circuit simulation results demonstrate that the associative memory according to the embodiment is capable of searching the Winner over the wide range of the distance between the reference data and the Winner at high speeds with low power consumption.

It is to be understood that the aforementioned examples have been described for the explanatory purpose rather than restrictive purpose. The scope of the present invention is intended to be defined by the appended claims rather than by the description preceding them, and all changes that fall within meets and bounds of the claims, or equivalence of such meets and bounds are intended to be embraced by the claims.

INDUSTRIAL APPLICABILITY

The scope of the present invention is not limited to the aforementioned embodiment. In the embodiment, the amplifier circuit according to the present invention is applied to the WLA circuit for realizing the pattern matching function of the fully parallel type associative memory. The WLA circuit which employs the amplifier circuit according to the present invention is not limited to be used for the pattern matching of the fully parallel type associative memory. For example, such circuit may be widely employed for the pattern matching to be performed in the network router, codebook base data compression, object recognition, artificial intelligence system, data bank system, internet router, mobile terminal (for example, mobile video terminal) and the like.

The invention claimed is:

1. An amplifier circuit comprising:
   a plurality of input nodes receiving a plurality of input voltages;
   a plurality of differential amplifiers provided corresponding to the plurality of input nodes, each having one input receiving a voltage of the corresponding input node; and
   a control circuit generating a control voltage that follows a minimum voltage or a maximum voltage of the plurality of input voltages from outputs of the plurality of differential amplifiers to supply the generated control voltage as a common value to the other inputs of the plurality of differential amplifiers.

2. The amplifier circuit according to claim 1, wherein:
   the control circuit includes:
   a plurality of first MOS transistors which are provided corresponding to the plurality of differential amplifiers, allow a gate to receive an output of the corresponding differential amplifier, and are connected in parallel between a node to which the other inputs of the plurality of differential amplifiers are commonly connected, and a node which receives a first power supply voltage; and
   a second MOS transistor connected between the node to which the other inputs of the plurality of differential amplifiers are commonly connected and a node which receives a second power supply voltage and allowing a gate to receive a predetermined bias voltage.

3. The amplifier circuit according to claim 2, further comprising a capacity connected to the node to which the other inputs of the plurality of differential amplifiers are commonly connected.

4. The amplifier circuit according to claim 2, further comprising a voltage follower circuit provided between a common connection node of the plurality of first MOS transistors and the second MOS transistor, and a common connection node of the other inputs of the plurality of differential amplifiers.

5. The amplifier circuit according to claim 2, further comprising a voltage reduction circuit provided between a common connection node of the plurality of first MOS transistors and the second MOS transistor, and a common connection node of the other inputs of the plurality of differential amplifiers and reducing the voltage supplied to the other inputs of the plurality of differential amplifiers.

6. An associative memory comprising:
   a memory array unit performing a parallel comparison between each of preliminarily stored plurality of reference data and input retrieval data and generating a plurality of comparison current signals having current values corresponding to the respective comparison results;
   a WLA (Winner Line-up Amplifier) circuit converting the plurality of comparison current signals into voltages to amplify; and
   a WTA (Winner Take All) circuit further amplifying an output from the WLA circuit, wherein:
   the WLA circuit includes:
   a plurality of current voltage conversion circuits provided corresponding to the plurality of comparison current signals to convert the corresponding comparison current signal into a comparison voltage signal;
   a plurality of differential amplifiers provided corresponding to the plurality of current-voltage conversion circuits to allow one input to receive the comparison voltage signal from the corresponding current-voltage conversion circuit; and
   a control circuit generating a control voltage which follows a minimum voltage or a maximum voltage of the plurality of comparison voltage signals from outputs of the plurality of differential amplifiers and supplying the generated control voltage as a common value to the other inputs of the plurality of differential amplifiers.

* * * * *